United States Patent
Piccini et al.

(10) Patent No.: US 8,648,594 B2
(45) Date of Patent: Feb. 11, 2014

(54) METHOD AND DEVICE FOR UNIFORM RADIAL DATA ACQUISITION IN THREE-DIMENSIONAL K-SPACE IN AN MR MEASUREMENT FOR A MAGNETIC RESONANCE SYSTEM

(75) Inventors: Davide Piccini, Erlangen (DE); Michael Zenge, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 610 days.

(21) Appl. No.: 12/912,096

(22) Filed: Oct. 26, 2010

(65) Prior Publication Data

US 2011/0095762 A1 Apr. 28, 2011

(30) Foreign Application Priority Data

Oct. 26, 2009 (DE) .......................... 10 2009 050 662

(51) Int. Cl.
*G01R 33/561* (2006.01)
*G01R 33/48* (2006.01)

(52) U.S. Cl.
USPC .............................. 324/307; 324/309; 324/318

(58) Field of Classification Search
USPC ............................ 324/300–322; 600/407–435; 382/128–131
See application file for complete search history.

(56) References Cited

U.S. PATENT DOCUMENTS

| | | | |
|---|---|---|---|
| 4,651,096 A | 3/1987 | Buonocore | |
| 5,349,294 A * | 9/1994 | Kasuboski | 324/309 |
| 6,281,681 B1 | 8/2001 | Cline et al. | |
| 6,710,686 B2 * | 3/2004 | Mertelmeier et al. | 324/314 |
| 7,109,707 B2 * | 9/2006 | Griffin | 324/307 |
| 7,127,092 B2 * | 10/2006 | Jack et al. | 382/128 |
| 7,245,124 B2 * | 7/2007 | Shu et al. | 324/307 |
| 7,548,062 B1 * | 6/2009 | Gurney | 324/309 |
| 7,728,588 B2 * | 6/2010 | Feiweier | 324/309 |
| 8,095,202 B2 * | 1/2012 | Shu et al. | 600/410 |
| 8,214,013 B2 * | 7/2012 | Shu et al. | 600/410 |
| 8,228,062 B2 * | 7/2012 | Sharp et al. | 324/309 |
| 2002/0175683 A1 * | 11/2002 | Mertelmeier et al. | 324/314 |
| 2003/0135105 A1 * | 7/2003 | Jack et al. | 600/410 |
| 2003/0153826 A1 * | 8/2003 | Jack et al. | 600/410 |
| 2004/0204641 A1 * | 10/2004 | Griffin | 600/410 |
| 2006/0226836 A1 * | 10/2006 | Shu et al. | 324/309 |
| 2008/0045828 A1 * | 2/2008 | Shu et al. | 600/410 |
| 2008/0061779 A1 * | 3/2008 | Feiweier | 324/307 |
| 2008/0154117 A1 * | 6/2008 | Nielles-Vallespin | 600/410 |
| 2008/0183067 A1 * | 7/2008 | Shu et al. | 600/410 |
| 2009/0099443 A1 * | 4/2009 | Rahmer et al. | 600/410 |
| 2010/0171499 A1 * | 7/2010 | Sharp et al. | 324/318 |
| 2011/0095762 A1 * | 4/2011 | Piccini et al. | 324/312 |
| 2013/0119983 A1 * | 5/2013 | Zenge | 324/309 |

OTHER PUBLICATIONS

"A Better Way to Construct the Sunflower Head," Vogel, Mathematical Biosciences, vol. 44 (1979) pp. 179-189.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

For radial data acquisition in three-dimensional k-space in an MR measurement for a magnetic resonance system, data in k-space are acquired along straight-line spokes. Each of the spokes is thereby defined by a point on a sphere and the center point of this sphere, wherein the center point corresponding to the center of k-space. The points are arranged on the sphere such that a distribution of the points obeys the spiral phyllotaxis, in particular the Fibonacci phyllotaxis.

29 Claims, 5 Drawing Sheets

(56) References Cited

OTHER PUBLICATIONS

"Temporal Stability of Adaptive 3D Radial MRI Using Multidimensional Golden Means," Chan et al., Magnetic Resonance in Medicine, vol. 61 (2009) pp. 354-363.

"Contact Pressure Models for Spiral Phyllotaxis and Their Computer Simulation," Hellwig et al., Journal of Theoretical Biology, vol. 240 (2006) pp. 489-500.

"A Collision-based Model of Spiral Phyllotaxis," Fowler et al., Computer Graphics, vol. 26 No. 2 (1992) pp. 361-368.

"Computer Simulation of Contact Pressure in Capitula," Ridley, Journal of Theoretical Biology, vol. 95 (1982) pp. 1-11.

"Phyllotaxis: An Interactive Site for the Mathematical Study of Plant Pattern Formation," Plant Spirals Exhibit, Smith College Botanic Garden.

* cited by examiner

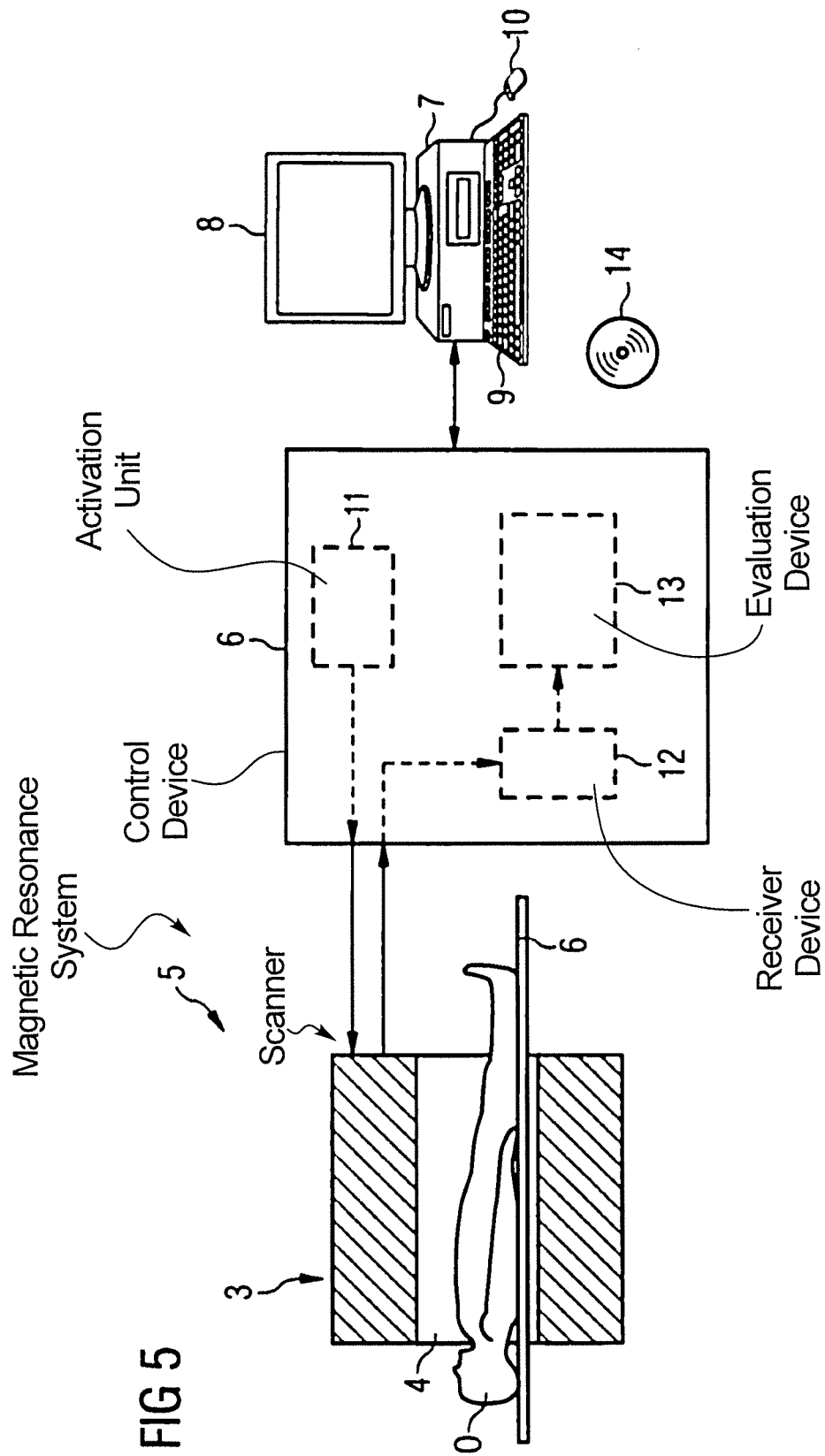

METHOD AND DEVICE FOR UNIFORM RADIAL DATA ACQUISITION IN THREE-DIMENSIONAL K-SPACE IN AN MR MEASUREMENT FOR A MAGNETIC RESONANCE SYSTEM

BACKGROUND OF THE INVENTION

1. Field of the Invention

The present invention concerns a method and a device for radial data acquisition in three-dimensional k-space in an MR measurement for a magnetic resonance system. Moreover, the present invention concerns a magnetic resonance system with the device described above.

2. Description of the Prior Art

In recent years radial three-dimensional data acquisition in k-space has become popular in the field of magnetic resonance tomography for a number of reasons. First, the data acquisition is very robust with regard to a movement (for example the movement of a patient in an MR examination) since, in the prevalent radial three-dimensional methods, each readout process (process in which multiple points of k-space are detected in one step) proceeds through the center of k-space. Moreover, radial three-dimensional data acquisition very simply enables a radial sub-sampling, so the sampling density (detected points per volume unit) is relatively low at the edges of k-space while it is relatively high in the environment of the center and in the center itself.

However, the radial three-dimensional data acquisition has the following two problem areas:

1. It is difficult to achieve an optimally uniform distribution of the data points detected in k-space.

2. Most methods for radial three-dimensional data acquisition have an interleaved procedure in which k-space is sampled repeatedly by detection steps. K-space of each detection step is thereby sampled coarsely, with every detection step essentially sampling or detecting different points of k-space than the respective other detection steps. Radial three-dimensional data acquisition of k-space is thereby composed of the results of all interleaved detection steps. The problem with this interleaved procedure is to select the order in which the points of k-space are acquired for one of the detection steps, such that this is accompanied by an optimally uniform gradient change of the magnetic field in order to minimize the eddy current effects caused by magnetic field changes.

According to a widely accepted approach to radial data acquisition in three-dimensional k-space, the data acquisition is composed of multiple readout processes, and wherein points along a spoke (i.e. a straight line segment) are detected per readout process, wherein this spoke is defined by a point on a sphere and the center point of this sphere. In other words, each spoke on which the points in k-space are detected by the corresponding readout process runs through this center point (which is located in the center of k-space) and through the corresponding point on the sphere. A spoke is thus differentiated from the other spokes by the corresponding point on the sphere since each spoke runs through the center point.

The points on the sphere (which respectively each define one of the spokes) lie on a trajectory which possesses the shape of a three-dimensional Archimedean spiral. The more points in k-space that are sampled, the more spokes exist and the more windings that the Archimedean spiral on the sphere has, so the separation of adjacent windings of the Archimedean spiral is reduced. In an interleaved procedure, for each acquisition step only every m-th spoke is sampled (when m corresponds to the number of acquisition steps). In other words—for example for the first acquisition step—the points on the spokes 1, (m+1), (2*m+1), (3*m+1) etc. are acquired while the points on the spokes k, (m+k), (2*m+k), (3*m+k) etc. are acquired for the k-th acquisition step (k≤m).

In this procedure a significant interleaving, i.e. m≫1, leads to a large gradient change of the magnetic field at the transition from one spoke to the next, which disadvantageously leads to artifacts which occur due to the effects of the eddy current.

For a radial data acquisition in three-dimensional k-space wherein the data are acquired by means of 1600 spokes, the points 1 defining these spokes are shown on a sphere 4 in FIGS. 1a, 1b and 1c. FIG. 1a shows the sphere 4 from above and FIG. 1b shows the sphere 4 at an angle from above. The depicted points 1 lie on a three-dimensional Archimedean spiral which forms the trajectory by means of which the order in which the individual spokes are processed is determined.

FIG. 1c depicts the trajectory 15 for one of these acquisition steps for the case that the entire data acquisition consists of 20 acquisition steps. The straight line segments thereby represent the transition from one spoke to the next. Since these straight line segments are relatively large at least in part, this leads to a relatively large variation in the gradient of the magnetic field that is necessary for data acquisition, which in turn induces strong eddy currents, which ultimately leads to artifacts in the imaging depending on the data acquisition.

However, the approach described above for radial data acquisition in three-dimensional k-space has the advantage of an extremely uniform sampling, so a compensation of the sampling density is significantly facilitated. The compensation of the sampling density is understood as the process in which the different sampling density (high in the center and low at the edge of k-space)—as noted above—for the imaging is compensated, such that the density of the image points (pixels) (determined from the acquired data) in the entire sampled volume is optimally uniform.

An additional approach to radial data acquisition in three-dimensional k-space is described in "Temporal Stability of Adaptive 3D Radial MRI Using Multidimensional Golden Means", R. W. Chan et al., Magnetic Resonance in Medicine 61, Pages 354-363, 2009. The proposed method executes (at least in a time period) a uniform sampling of a two-dimensional normalized space, so the concept of the golden segment is used together with a modified Fibonacci series in order to distribute the points 1 on a sphere 4, wherein these points 1 respectively define a spoke for radial data acquisition. This sampling pattern is transferred to a spherical surface by the coordinates of the planar sampling points being coupled with the polar angle and the azimuthal angle within the three-dimensional space. The result of such a pattern is shown in FIG. 2a as a view of the sphere 4 from above and in FIG. 2b as a view of the sphere at an angle from above.

This approach is aimed at an optimally uniform sampling in the time curve. Nevertheless, with a Voronoi analysis the result is reached that the sampling distribution is not particularly uniform within a time frame. This approach consequently requires a complicated compensation of the sampling density. Ultimately, exposures are not optimally avoided with this approach.

In summary it is to be noted that the approaches to radial data acquisition in three-dimensional k-space according to the prior art are optimized either with regard to a uniform sampling density (spatial or temporal) or with regard to a suitable compensation of eddy currents (with regard to avoiding eddy currents that are too large). In most cases a complicated compensation of the sampling density is required.

SUMMARY OF THE INVENTION

An object of the present invention is to provide a method and device for radial data acquisition in wherein both a uniform spatial sampling density and an avoidance of overly large eddy currents are ensured, and wherein only a simple compensation of the sampling density is required.

This object is achieved in accordance with the present invention by a method for radial data acquisition in three-dimensional k-space in an MR measurement for a magnetic resonance system. Data in k-space are acquired along straight-line spokes. Each of these spokes is defined by a point on a sphere and the center point of this sphere (i.e. the point on the sphere and the center point lie on this spoke), with the center point of the sphere corresponding to the center of k-space. The points are arranged on the sphere or spherical surface such that the points or the distribution of the points corresponds to the spiral phyllotaxis, in particular the Fibonacci (spiral) phyllotaxis.

As used herein "phyllotaxis" means the leaf position or the leaf state in plants. The "leaf position" means the arrangement of leaf-like organs of a plant. Leaf-like organ includes leaves and carpels of a plant, for example the scales of a pine cone, the fruit of a banana plant and the seeds in a sunflower bloom. The arrangement of the leaf-like organs according to phyllotaxis is frequently also spiral-shaped, and the structure of these spirals obeys specific rules. These rules are defined according to the spiral phyllotaxis; as described in "A Collision-based Model of Spiral Phyllotaxis", D. R. Fowler et al., Proceedings of SIGGRAPH 1992, in Computer Graphics, July 1992, ACM SIGGRAPH, New York, pages 361-368.

In the spiral phyllotaxis a divergence angle that exhibits an arbitrary point relative to its predecessor point is always constant. The divergence angle is defined relative to a center point in which a spiral that is formed by the point winds. Expressed otherwise, the divergence angle describes an angle that occurs at a center point in a triangle which is constructed from the point, it predecessor point and the center point.

In the present invention, the points lie on a spherical surface. If the position of an arbitrary one of these points is determined by means of spherical coordinates (coordinate origin=center point of the sphere), for the case that the points are arranged on a sphere according to the spiral phyllotaxis it then applies that a difference angle always has the same value or is constant between the azimuthal angle of an arbitrary one of these points and the azimuthal angle of its predecessor point. This difference angle can also be viewed as the divergence angle.

The Fibonacci phyllotaxis is a special case of the spiral phyllotaxis, wherein the divergence angle in the Fibonacci phyllotaxis corresponds to one of the golden angles (see Equations (1) and (2) below).

For a better comprehension of the Fibonacci phyllotaxis, also refer in this context to "A Better Way to Construct the Sunflower Head, H. Vogel, Mathematical Biosciences 44: Pages 179-189, 1979.

If, for definition of the spokes, the points are arranged on the sphere or spherical surface corresponding to the spiral phyllotaxis, in particular corresponding to the Fibonacci phyllotaxis, the distribution of the sample points is more uniform than is the case given the approach which is described in "Temporal Stability of Adaptive 3D Radial MRI Using Multidimensional Golden Means", R. W. Chan et al., Magnetic Resonance in Medicine 61, Pages 354-363, 2009. A reduction of the eddy current effects advantageously results relative to the approach in which the points are arranged on the sphere in the form of an Archimedean spiral.

In order to arrange the points on the sphere corresponding to the spiral phyllotaxis (in particular the Fibonacci phyllotaxis) to define the spokes, the points can be arranged either by means of the Voronoi diagram or by means of the "Contact Pressure Model" (see "Contact pressure models for spiral phyllotaxis and their computer simulation", H. Hellwig et al., Journal of Theoretical Biology 240 (2006), Pages 489-500).

A Voronoi diagram designates a decomposition of space in regions that are defined by a predetermined set of points of the space which are designated as centers. Every region is defined by precisely one center and comprises all points of the space that, in relation to Euclidean metrics, lies closer to the center of the region than to every other center. Such regions are also designated as Voronoi regions. The Voronoi diagram is created from all points that possess more than one nearest center and thus form the limits of the regions.

According to a preferred embodiment of the invention, N spokes are processed for data acquisition of three-dimensional k-space, meaning that the number of processed spokes is N. Each point on the sphere by which one of these spokes is defined is defined by the center point of the sphere via a polar angle and an azimuthal angle. In other words, assuming a Cartesian coordinate system with the origin equal to the center point of the sphere, the polar angle describes that angle between the positive x-axis of this coordinate system and the spoke defined by the corresponding point while the azimuthal angle defines the size between the positive z-axis of this coordinate system and this spoke. The polar angle of the spoke n or n-th spoke is dependent on (for example proportional to) the root of n or, respectively, $\sqrt{n}$ or dependent on (for example proportional to) the root of the number of spokes (N) or $\sqrt{N}$. It is also possible that the polar angle is dependent both on (for example proportional to) $\sqrt{n}$ and on (for example proportional to) $\sqrt{N}$.

According to a further embodiment according to the invention, the azimuthal angle of the nth spoke is dependent on (for example proportional to) n or dependent on (for example proportional to) the golden angle. Moreover, it is possible that the azimuthal angle is both dependent on (for example proportional to) n and dependent on (for example proportional to) one of the golden angles. In the present invention, what is thereby understood by a golden angle $\psi$ is either what is known as the small golden angle $\psi_1$ or what is known as the large golden angle $\psi_2$. The small golden angle $\psi_1$ is defined according to the following Equation (1):

$$\Psi_1 = 360° - \frac{720°}{1 + \sqrt{5}} \approx 137,5°. \tag{1}$$

The large golden angle $\psi_2$ is defined according to the following Equation (2):

$$\Psi_2 = \frac{720°}{1 + \sqrt{5}} \approx 222.5° \tag{2}$$

According to a preferred embodiment according to the invention, the polar angle $\theta_n$ of the spoke n or, respectively, the nth spoke is determined corresponding to the following Equation (3):

$$\Theta_n = \frac{\pi \times \sqrt{n}}{2 \times \sqrt{N}} \quad (3)$$

According to a further preferred embodiment according to the invention, the azimuthal angle $\phi_n$ of the spoke n or, respectively, the nth spoke is determined corresponding to the following Equation (4):

$$\Phi_n = \mathrm{mod}(n \times \Psi, 2 \times \pi) \quad (4)$$

In other words, according to the invention two different definitions of the azimuthal angle $\phi_n$ exist. In the first definition the azimuthal angle $\phi_n$ is defined with the small golden angle (i.e. $\psi = \psi_1$) and in the second definition the azimuthal angle $\phi_n$ is defined with the large golden angle (i.e. $\psi = \psi_2$). In particular in the definition of the points on the spherical surface (and therefore of the spokes) only the first definition of the azimuthal angle $\phi_n$ or only the second definition of the azimuthal angle $\phi_n$ is thereby used.

Both the polar angle and the azimuthal angle in a closed shape can be calculated with the aid of Equations (3) and (4) depending on the total number of spokes N and depending on the respective index n of the respective spoke to be determined, whereby the respective spoke is then defined. A time-consuming iteration or optimization to determine the distribution of the points on the spherical surface is advantageously avoided.

According to the invention it is also possible that, instead of the small golden angle $\psi_1$, or instead of the large golden angle $\psi_2$, a small angle $\psi_1'$ or a large angle $\psi_2'$ is used in Equation (4) which essentially corresponds to the small golden angle or, respectively, the large golden angle in that the small angle $\psi_1'$ obeys the following Equation (5) and the large angle $\psi_2'$ obeys the following Equation (6):

$$0.9 * \psi_1 \le \psi_1' \le 1.1 * \psi_1 \quad (5)$$

$$0.9 * \psi_2 \le \psi_2' \le 1.1 * \psi_2 \quad (6)$$

According to one embodiment according to the invention, all spokes which are to be processed for radial data acquisition are subdivided into M sets. Corresponding to a predetermined order of the spokes, the spokes are assigned to one of the M sets such that the k-th spoke, the (k+M)-th spoke, the (k+2*M)-th spoke . . . belongs to the k-th set. In the data acquisition the data in k-space are first acquired for all spokes of one of these sets before the data of all spokes for the next set are acquired. The number M of sets is advantageously selected such that it is a Fibonacci number. Since the Fibonacci numbers also comprise the number 1, it is accordingly also possible that all spokes belong to the same set.

If the number M corresponds to a Fibonacci number, the predetermined order of two successive spokes of the same set advantageously exhibits a corresponding interval. The change between a magnetic field gradient to acquire the one of these two spokes and a magnetic field gradient to acquire the other of these two spokes is advantageously small, such that only slight eddy current effects occur so that a compensation of these eddy current effects by means of a complicated algorithm can be omitted.

It is naturally also possible that the order in which the spokes of a specific set (one of the M sets) are processed for data acquisition is determined such that the distance between spokes that is processed in direct succession is minimal. For example, that order in which the sum of the distances between two spokes processed in direct succession exhibits a minimum could be determined by means of an optimization method. The distance between two spokes could be defined by the line which connects the two points (via which the respective spoke is defined) on the spherical surface.

In one example according to the invention, every N spokes are defined with the aid of Equations (2) and (3), wherein the order is established by the index n. In other words, according to this predetermined order the spoke which is defined by the polar angle $\theta_{n+1}$ and the azimuthal angle $\phi_{n+1}$ is directly that spoke which is defined by the polar angle $\theta_n$ and the azimuthal angle $\phi_n$. These spokes defined in such a manner are now divided up into M different sets so that the spoke with index 1 (defined by the polar angle $\theta_1$ and the azimuthal angle $\phi_1$), the spoke with index (1+M) (defined by the polar angle $\theta_{1+M}$ and the azimuthal angle $\phi_{1+M}$), the spoke with index (1+2*M) (defined by the polar angle $\theta_{1+2*M}$ and the azimuthal angle $\phi_{1+2*M}$), the spoke with index (1+3*M) (defined by the polar angle $\theta_{1+3*M}$ and the azimuthal angle $\phi_{1+3*M}$) etc. are present in the set 1. Accordingly, the spoke with the index k (defined by the polar angle $\theta_k$ and the azimuthal angle $\phi_k$), the spoke with index (k+M) (defined by the polar angle $\theta_{k+M}$ and the azimuthal angle $\phi_{k+M}$), the spoke with index (k+2*M) (defined by the polar angle $\theta_{k+2*M}$ and the azimuthal angle $\phi_{k+2*M}$), the spoke with index (k+3*M) (defined by the polar angle $\theta_{k+3*M}$ and the azimuthal angle $\phi_{k+3*M}$) etc. are located in the k-th set.

If the number M corresponds to a Fibonacci number, the spokes of an arbitrary one of the M sets are processed in an order which is provided by the index. In other words, for the k-th set the spoke with the index k is processed first, then the spoke with the index (k+M), then the spoke with the index (k+2*M), then the spoke with the index (k+3*M). Due to the fact that the spokes are defined with the use of Equations (2) and (3), it is then ensured that almost no eddy current effects occur between two successive spokes.

If, in contrast to this, the number M does not correspond to a Fibonacci number, large gradient changes normally exist between two successive spokes, such that it is advisable to not define the order in which the spokes of a set are processed as the same as that order which is provided by the index. In this case the order can be selected such that the distances between two successive spokes is respectively as small as possible, which naturally can indicate a complicated optimization.

Within the scope of the present invention, a device is also provided for a magnetic resonance system for radial data acquisition in three-dimensional k-space in an MR measurement. The device has a control unit to control the magnetic resonance system; a receiver device to receive MR data acquired by the magnetic resonance system; and an evaluation device to evaluate the MR data. The device is designed such that data in k-space are acquired along spokes running in straight lines. Each spoke is defined by a point on the sphere and the center point of the sphere, wherein the center point of the sphere corresponds to the center of k-space. The device arranges the points on the spherical surface such that the distribution of the points obeys the spiral phyllotaxis (even better the Fibonacci phyllotaxis).

The advantages of the device according to the invention essentially correspond to the advantages of the method according to the invention which have been described in detail in the preceding.

Moreover, the present invention encompasses a magnetic resonance system that includes the device according to the invention that is described in the preceding.

The present invention embodies an electronically readable data storage medium—for example a DVD, a magnetic tape or a USB stick—on which is stored electronically readable control information, in particular software. All embodiments according to the invention of the method that is described in the preceding can be implemented when this control information (software) are read from the data medium and stored in a controller or, respectively, computer of a magnetic resonance system.

The programming instructions of the computer-readable storage medium include, for example, libraries and auxiliary functions in order to realize the corresponding embodiments of the method. The programming instructions represent software with which any of the embodiments of the method according to the invention that are described above can be executed. The software can thereby be a source code (for example in C++) that must still be compiled and linked or that must merely be interpreted, or it can be an executable software code that is merely to be loaded into the corresponding computer for execution.

The present invention is particularly suitable for radial data acquisition in three-dimensional k-space in an MR measurement (magnetic resonance measurement) Naturally, the present invention is not limited to this preferred apparatus field since the present invention could also be used in other imaging methods, for example (x-ray computer tomography, positron emission tomography, for example).

BRIEF DESCRIPTION OF THE DRAWINGS

FIG. 5 depicts a magnetic resonance system according to the invention with a device according to the invention.

DESCRIPTION OF THE PREFERRED EMBODIMENTS

Figure 1A:
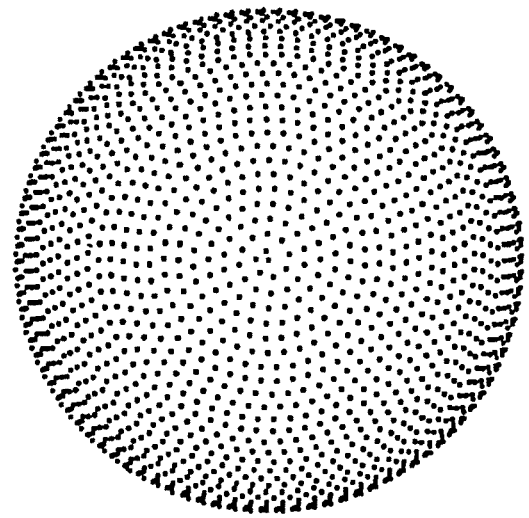
FIGS. 1a, 1b and 1c depict a first embodiment for radial data acquisition in three-dimensional k-space according to the prior art.
Figure 1B:
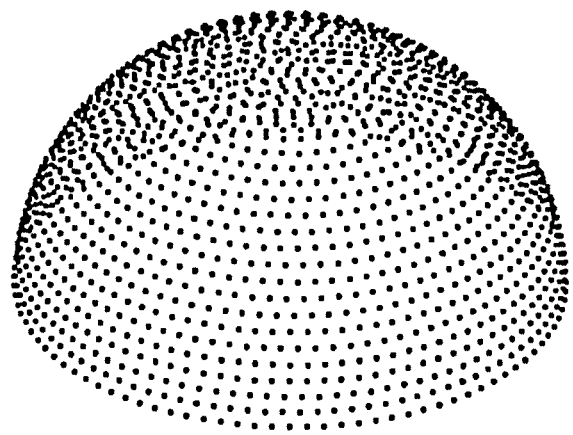
Figure 1C:
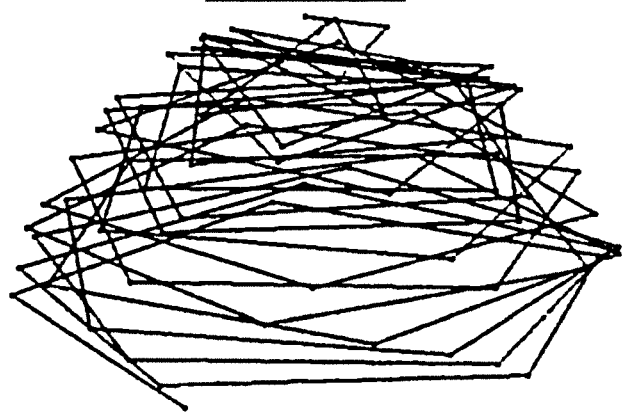
Figure 2A:
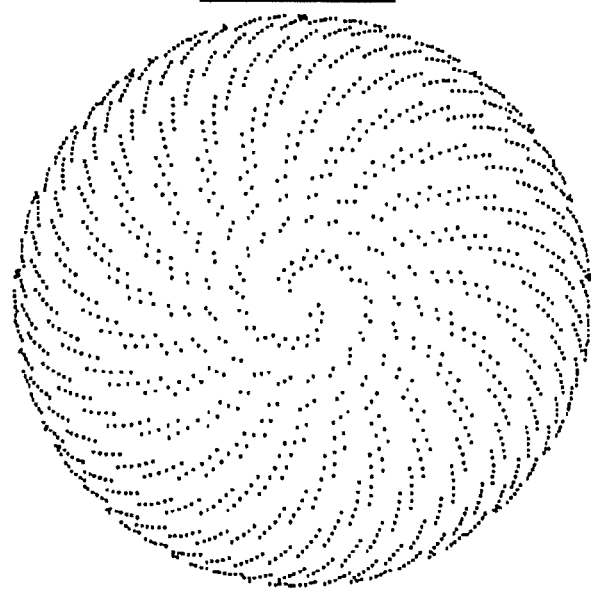
FIGS. 2a and 2b depict a second embodiment for radial data acquisition in three-dimensional k-space according to the prior art.
Figure 2B:
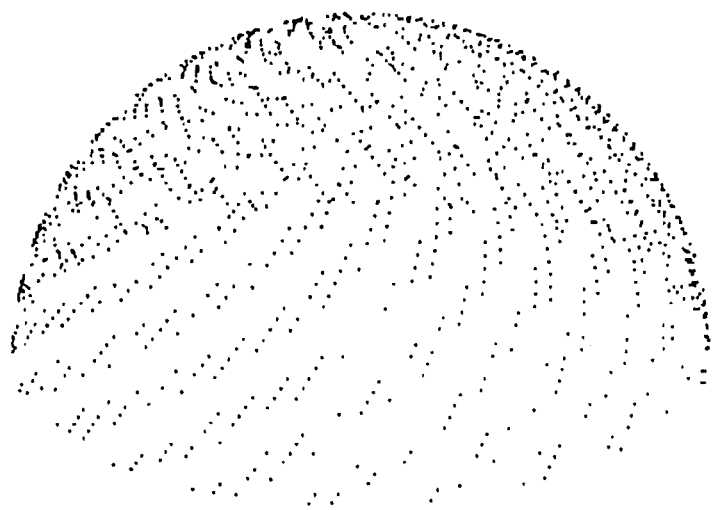
Figure 3B:
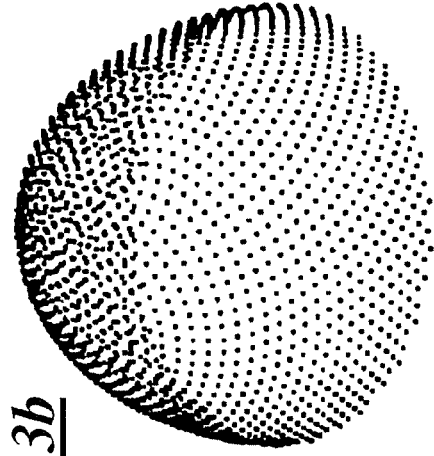
FIGS. 3a and 3b depict a distribution of points to define spokes on a spherical surface according to one embodiment according to the invention.

Points on a spherical surface 4 which have been calculated with the Equations (2) and (3) described above are shown in FIGS. 3a and 3b. N was selected as 1600, such that 1600 points 1 which define 1600 spokes are present on the spherical surface 4. FIG. 3a shows the sphere 4 from above while FIG. 3b depicts the sphere 4 at an angle from above. The uniform distribution of the points 1 on the spherical surface 4 is apparent from FIGS. 3a and 3b. An implicit order of the 1600 points 1 is also defined by the running index n in Equations (2) and (3).

Figure 3D:
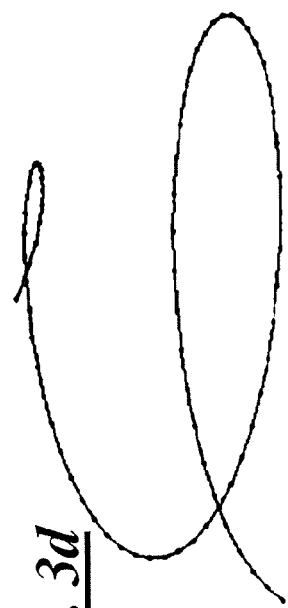
FIG. 3d depicts a trajectory according to a processing of the spokes defined corresponding to FIGS. 3a and 3b that is according to the invention.
Figure 3A:
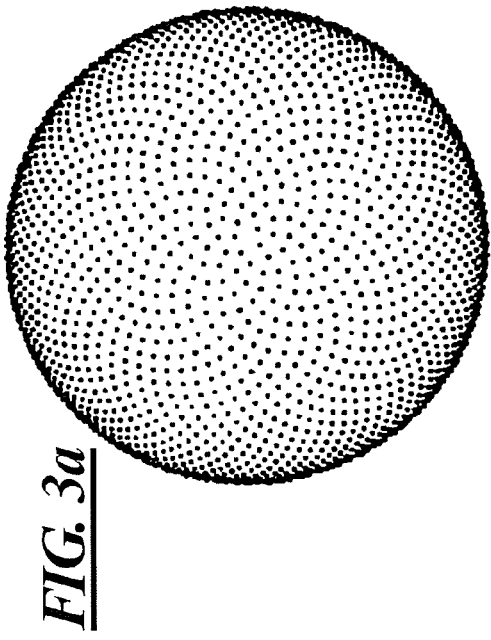
Figure 3C:
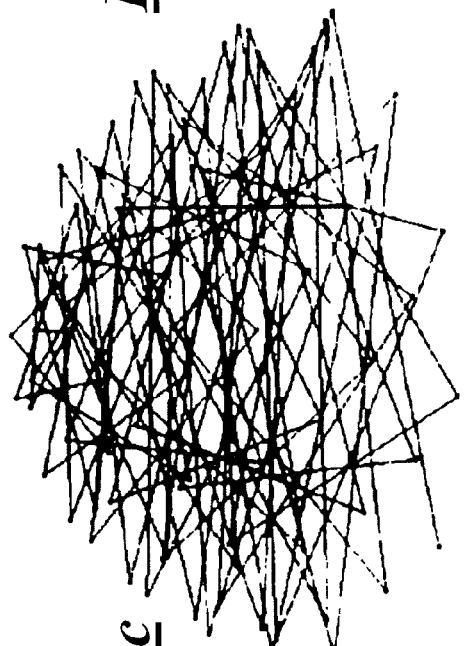
FIG. 3e depicts a trajectory according to a processing of the spokes defined corresponding to FIGS. 3a and 3b that is not according to the invention.

If the 1600 spokes are divided into 20 sets or groups—wherein the k-th spoke, the (k+20)-th spoke, the (k+2*20)-th spoke, the (k+3*20)-th spoke etc. is assigned to the k-th set—the trajectory 15 shown in FIG. 3c results for one of these sets. The trajectory 15 shown in FIG. 3c thereby connects the points 1 of the corresponding set according to the aforementioned implicit order. It is apparent that the straight line segments of the trajectory 15 (whose length represents a measurement of a change of the magnetic field gradients) are relatively long, which disadvantageously leads to marked eddy current effects. The reason for these disadvantageous eddy current effects lies in the selection of the number of sets since the selected number 20 is not a Fibonacci number.

If the 1600 spokes are divided into 21 sets or groups—wherein the k-th spoke, the (k+21)-th spoke, the (k+2*21)-th spoke, the (k+3*21)-th spoke etc. is assigned to the k-th of these 20 [sic] sets—the trajectory 15 shown in FIG. 3d results for one of these sets. It is apparent that the straight line segments of this trajectory 15 is significantly shorter than in the trajectory 15 in FIG. 3c. The processing of the spokes (which are defined by the points 1) according to the trajectory 15 shown in FIG. 3d therefore leads to significantly smaller exposure effects than is the case given the trajectory 15 shown in FIG. 3c. The reason is simple: the selected number 21 is a Fibonacci number.

Figure 4C:
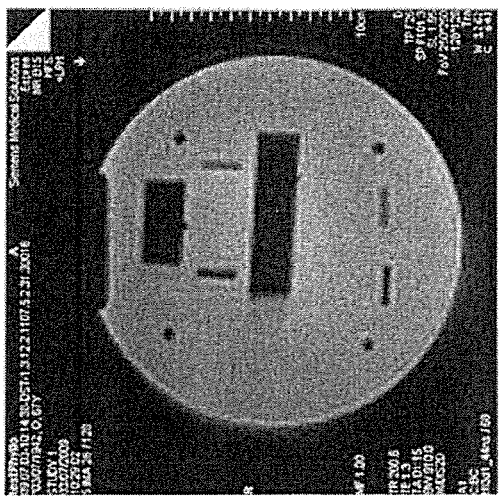
FIGS. 4a, 4b and 4c show results of different phantom experiments are depicted which show the effects of the exposure in a three-dimensional TrueFISP sequence for different embodiments of a radial data acquisition in three-dimensional k-space.
Figure 4B:
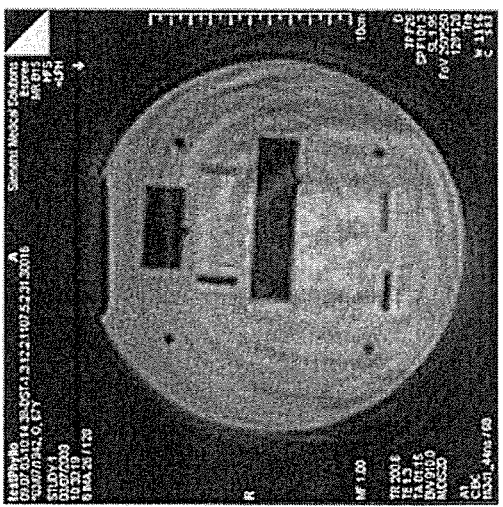
Figure 4A:
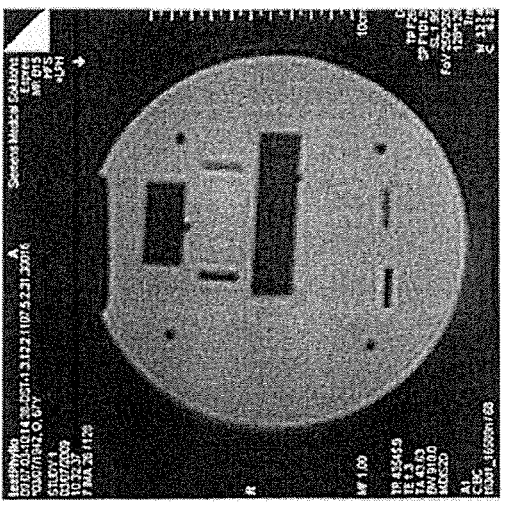

Results of phantom experiments for various embodiments of a radial data acquisition in three-dimensional k-space are shown in FIGS. 4a, 4b and 4c.

The result for 1588 spokes which are defined by means of points on the spherical surface which are arranged corresponding to an Archimedean spiral on the spherical surface is shown in FIG. 4a The spokes were thereby not acquired in an interleaved manner which means that the 1588 spokes were not divided into different sets for data acquisition. It is apparent that no artifacts are to be detected in FIG. 4a since, due to the fact that the interleaving is not present, two spokes in succession for data acquisition respectively possess an extremely small separation, such that nearly no eddy current effects occur.

In contrast to this, if the 1588 spokes are subdivided into 377 sets and the spokes of one of these sets are processed in the order predetermined by the Archimedean spiral for data acquisition, the image shown in FIG. 4b results. Significant artifacts which are caused by large eddy current effects are apparent in FIG. 4b. It is thereby to be noted that the number of 377 sets is a Fibonacci number.

In contrast to this, for the result shown in FIG. 4c the points on the spherical surface which define the spokes are arranged according to the invention so that a distribution of the points obeys the Fibonacci phyllotaxis. The pokes are likewise divided up into 377 sets and the radial data acquisition ensues in that the spokes have been processed set by set (for all 377 sets). The result from this, which is depicted in FIG. 4c, shows that nearly no perceptible artifacts have occurred due to eddy current effects. It is thus shown that the selection of a Fibonacci number for the number of sets is only advantageous if the points on the spherical surface which define the spokes for radial data acquisition exhibit a distribution obeying the Fibonacci phyllotaxis, which is required according to the invention.

A magnetic resonance system 5 according to the invention is schematically depicted in FIG. 5. The magnetic resonance system 5 significantly has: a scanner 3 with which the magnetic field necessary for the MR examination is generated in a measurement space 4; a table 2; a control device 6 with which the scanner 3 is controlled and MR data from the scanner 3 are acquired; and a terminal 7 connected to the control device 6.

For its part the control device 6 comprises an activation unit 11, a receiver device 12 and an evaluation device 13. During an MR examination MR data are acquired by the receiver device 12 by means of the scanner 3, wherein the scanner 3 and the table 2 are activated by the activation unit 11 such that MR data in a measurement volume which is located inside the body of a patient O lying on the table 2 are acquired.

The evaluation device 13 then prepares the MR data such that they can be graphically presented on a monitor 8 of the terminal 7 and such that images created according to the invention can be displayed. In addition to the graphical depiction of the MR data, a three-dimensional volume segment to be measured (for example) can be predetermined by a user with the terminal 7 (which comprises a keyboard 9 and a mouse 10 in addition to the monitor 8) and additional parameters for implementation of the method according to the invention can be determined. The software for the control device 6 can also be loaded via the terminal 7 into the control device 6, in particular into the evaluation device 13. This software of the control device 6 can thereby also comprise the method according to the invention. It is thereby also possible that a method according to the invention is contained in a software which runs in the terminal 7. Independent of in which software the method according to the invention is contained, the software can also be stored on a DVD 14, such that this software can then be read from the DVD 14 by the terminal 7 and can either be copied into the control device 6 or into a processing unit of the terminal 7 itself.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for uniform radial data acquisition of magnetic resonance data in three-dimensional k-space, comprising the steps of:
   with a magnetic resonance data acquisition system comprising a memory into which acquired magnetic resonance data are entered in k-space, entering acquired magnetic resonance data in k-space in said memory along straight-line spokes, wherein k-space in said memory comprises a center of k-space;
   defining each of said spokes in k-space in said memory by one point among a plurality of points on a sphere, and a center point of said sphere, said center point of said sphere coinciding with said center of k-space; and
   in k-space in said memory, defining said points on said sphere in a distribution of said points that obeys spiral phyllotaxis; and
   thereby produce a data file in said memory in an electronic format that is electronically accessible in order to generate a magnetic resonance image from said data file.

2. A method as claimed in claim 1 comprising arranging said points on said sphere in k-space with said distribution of points also obeying Fibonacci phyllotaxis.

3. A method as claimed in claim 1 comprising arranging said points on said sphere according to a Voronoi diagram.

4. A method as claimed in claim 1 comprising defining said points so as to obey spiral phyllotaxis on said sphere according to a contact pressure model.

5. A method as claimed in claim 1 comprising organizing said points in k-space with a number of said spokes that are processed for data acquisition being equal to N, and wherein each point on said sphere is defined by a polar angle and an azimuthal angle, and wherein said polar angle of an n-th spoke is formed dependent on a root selected from the group consisting of the root of n and the root of N.

6. A method as claimed in claim 5 wherein the polar angle of the n-th spoke is proportional to said root.

7. A method as claimed in claim 5 wherein the polar angle $\Theta_n$ of the n-th spoke is:

$$\Theta_n = \frac{\pi \times \sqrt{n}}{2 \times \sqrt{N}}.$$

8. A method as claimed in claim 1 comprising organizing said points in k-space with a number of said spokes that are processed for data acquisition being equal to N, and wherein each point on said sphere is defined by a polar angle and an azimuthal angle, and wherein the azimuthal angle of an n-th spoke is formed dependent on at least one of n and the golden angle.

9. A method as claimed in claim 8 wherein the azimuthal angle of the n-th spoke is $\phi_n$ and wherein the golden angle is $\psi$:

$$\Phi_n = \mathrm{mod}(n \times \Psi, 2 \times \pi).$$

10. A method as claimed in claim 8 comprising selecting the golden angle from the group consisting of the small golden angle and the large golden angle.

11. A method as claimed in claim 1 comprising organizing said points in k-space with a number of said spokes that are processed for data acquisition being equal to N, and wherein each point on said sphere is defined by a polar angle and an azimuthal angle, and wherein said polar angle of an n-th spoke is formed dependent on a root selected from the group consisting of the root of n and the root of N, and wherein the azimuthal angle of the n-th spoke is formed dependent on at least one of n and the golden angle.

12. A method as claimed in claim 1 comprising dividing said spokes into M sets, and associating a k-th spoke, a (k+M)-th spoke, a (k+2·M)-th spoke respectively with a k-th of said M sets according to a predetermined order of said spokes, and acquiring said data in k-space initially along all spokes of a respective one of said M sets before acquiring the data for another of said M sets along said spokes.

13. A method as claimed in claim 12 comprising selecting N to be a Fibonacci number and selecting a further order for processing spokes of one of said M sets to correspond to said predetermined order.

14. A method as claimed in claim 12 comprising selecting an additional order in which spokes of one of said M sets are processed for data acquisition in order to make a distance between spokes that are processed in direct succession with respect to each other as small as possible.

15. A magnetic resonance system configured for uniform radial data acquisition of magnetic resonance data in three-dimensional k-space, comprising:
   a magnetic resonance data acquisition system comprising
      a memory into which acquired magnetic resonance data are entered in k-space;
      a computerized control unit configured to operate said data acquisition system in order to enter acquired magnetic resonance data in k-space in said memory along straight-line spokes, wherein k-space in said memory comprises a center of k-space;
      said memory being configured to define each of said spokes in k-space in said memory by one point among a plurality of points on a sphere, and a center point of said sphere, said center point of said sphere coinciding with said center of k-space; and said memory being configured to define, in k-space within said memory, said points on said sphere, in a distribution of said points that obeys spiral phyllotaxis; and thereby produce a data file in said memory in an electronic format that is electronically accessible in order to generate a magnetic resonance image from said data file.

16. A system as claimed in claim 15 wherein said memory is configured with said points on said sphere in k-space with said distribution of said points obeying Fibonacci phyllotaxis.

17. A system as claimed in claim 15 said memory is configured with said points on said sphere according to a Voronoi diagram.

18. A system as claimed in claim 15 said memory is configured with said points defined on said sphere in said spiral phyllotaxis according to a contact pressure model.

19. A system as claimed in claim 15 said memory is configured with said points organized in k-space with a number of said spokes that are processed for data acquisition being equal to N, and wherein each point on said sphere is defined by a polar angle and an azimuthal angle, and wherein said polar angle of an n-th spoke is formed dependent on a root selected from the group consisting of the root of n and the root of N.

20. A system as claimed in claim 19 said memory is configured with the polar angle of the n-th spoke is proportional to said root.

21. A system as claimed in claim 19 said memory is configured with the polar angle $\theta_n$ of the n-th spoke is:

$$\Theta_n = \frac{\pi \times \sqrt{n}}{2 \times \sqrt{N}}.$$

22. A system as claimed in claim 15 said memory is configured with said points organized in k-space with a number of said spokes that are processed for data acquisition being equal to N, and wherein each point on said sphere is defined by a polar angle and an azimuthal angle, and wherein the azimuthal angle of an n-th spoke is formed dependent on at least one of n and the golden angle.

23. A system as claimed in claim 22 said memory is configured with the azimuthal angle of the n-th spoke is $\phi_n$ and wherein the golden angle is $\psi$:

$$\Phi_n = \mathrm{mod}(n \times \Psi, 2 \times \pi).$$

24. A system as claimed in claim 22 said memory is configured with the golden angle selected from the group consisting of the small golden angle and the large golden angle.

25. A system as claimed in claim 15 said memory is configured with said points organized in k-space with a number of said spokes that are processed for data acquisition being equal to N, and wherein each point on said sphere is defined by a polar angle and an azimuthal angle, and wherein said polar angle of an n-th spoke is formed dependent on a root selected from the group consisting of the root of n and the root of N, and wherein the azimuthal angle of the n-th spoke is formed dependent on at least one of n and the golden angle.

26. A system as claimed in claim 15 said memory is configured with said spokes divided into M sets, and associating a k-th spoke, a (k+M)-th spoke, a (k+2·M)-th spoke respectively with a k-th of said M sets according to a predetermined order of said spokes, and acquiring said data in k-space initially along all spokes of a respective one of said M sets before acquiring the data for another of said M sets along said spokes.

27. A system as claimed in claim 26 said memory is configured with N selected to be a Fibonacci number and with a further order for processing spokes of one of said M sets selected to correspond to said predetermined order.

28. A system as claimed in claim 26 said memory is configured with an additional order in which spokes of one of said M sets are processed for data acquisition being selected to make a distance between spokes that are processed in direct succession with respect to each other as small as possible.

29. A non-transitory computer-readable storage medium encoded with programming instructions loaded into a computerized control and evaluation system of a magnetic resonance system comprising: a memory, said programming instructions causing said computerized control and evaluation to operate said magnetic resonance system in order to:

enter acquired magnetic resonance data are into k-space in said memory along straight-line spokes, wherein k-space in said memory comprises a center of k-space;

define each of said spokes in k-space in said memory by one point among a plurality of points on a sphere, and a center point of said sphere, said center point of said sphere coinciding with said center of k-space; and in k-space in said memory, define said points on said sphere in a distribution of said points that obeys spiral phyllotaxis; and thereby produce a data file in said memory in an electronic format that is electronically accessible in order to generate a magnetic resonance image from said data file.

* * * * *